United States Patent
Jin et al.

(10) Patent No.: US 9,716,120 B2
(45) Date of Patent: Jul. 25, 2017

(54) IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Yong Wan Jin, Seoul (KR); Kwang Hee Lee, Hwaseong-si (KR); Gae Hwang Lee, Seongnam-si (KR); Kyung Bae Park, Hwaseong-si (KR); Dong-Seok Leem, Hwaseong-si (KR); Yeong Suk Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/283,743

(22) Filed: Oct. 3, 2016

(65) Prior Publication Data

US 2017/0141143 A1    May 18, 2017

(30) Foreign Application Priority Data

Nov. 17, 2015 (KR) .......................... 10-2015-0161397

(51) Int. Cl.
*H01L 31/00* (2006.01)
*H01L 27/146* (2006.01)

(52) U.S. Cl.
CPC .................................. *H01L 27/146* (2013.01)

(58) Field of Classification Search
CPC ..................................................... H01L 27/146
USPC ......................................................... 257/443
See application file for complete search history.

(56) References Cited

U.S. PATENT DOCUMENTS

| | | |
|---|---|---|
| 6,300,612 B1 | 10/2001 | Yu |
| 6,894,265 B2 | 5/2005 | Merrill et al. |
| 7,129,446 B2 | 10/2006 | Imaoka |
| 7,760,254 B2 | 7/2010 | Suzuki |
| 7,816,169 B2 | 10/2010 | Fan et al. |
| 8,481,908 B2 | 7/2013 | Inaba |

(Continued)

FOREIGN PATENT DOCUMENTS

JP  WO 2016129406 A1 *  8/2016 ............... G02B 7/34
KR  1377650 B1  3/2014

OTHER PUBLICATIONS

Aihara et al., "Stacked Image Sensor With Green- and Red-Sensitive Organic Photoconductive Films Applying Zinc Oxide Thin-Film Transistors to a Signal Readout Circuit," IEEE Transactions on Electron Devices, Nov. 2009, vol. 56, No. 11.

(Continued)

*Primary Examiner* — David S Blum
(74) *Attorney, Agent, or Firm* — Harness, Dickey & Pierce P.L.C.

(57) ABSTRACT

An image sensor includes a semiconductor substrate integrated with at least one of a first photo-sensing device that may sense a first wavelength spectrum of visible light and a second photo-sensing device that may sense second wavelength spectrum of visible light, and a third photo-sensing device on the semiconductor substrate that may selectively sense third wavelength spectrum of visible light in a longer wavelength spectrum of visible light than the first wavelength spectrum of visible light and the second wavelength spectrum of visible light. The first photo-sensing device and the second photo-sensing device may overlap with each other in a thickness direction of the semiconductor substrate.

21 Claims, 4 Drawing Sheets

(56) References Cited

U.S. PATENT DOCUMENTS

| | | |
|---|---|---|
| 8,653,618 B2 | 2/2014 | Kim |
| 8,907,262 B2 | 12/2014 | Yamaguchi |
| 8,981,515 B2 | 3/2015 | Hatano et al. |
| 2005/0206755 A1 | 9/2005 | Yokoyama et al. |
| 2014/0138665 A1 | 5/2014 | Takizawa |
| 2015/0162365 A1* | 6/2015 | Chang ............... H01L 27/14621 257/460 |
| 2016/0035770 A1* | 2/2016 | Ahn .................... H01L 27/1463 257/432 |
| 2016/0358969 A1* | 12/2016 | Fu ..................... H01L 27/14645 |
| 2017/0040544 A1* | 2/2017 | Lee .................... H01L 51/0053 |

OTHER PUBLICATIONS

Higashi et al., "Enhancing spectral contrast in organic red-light photodetectors based on a light-absorbing and exciton-blocking layered system," American Institute of Physics, Aug. 3, 2010, Journal of Applied Physics, vol. 108,034502.

\* cited by examiner

IMAGE SENSOR AND ELECTRONIC DEVICE INCLUDING THE SAME

CROSS-REFERENCE TO RELATED APPLICATIONS

This application claims priority to and the benefit of Korean Patent Application No. 10-2015-0161397 filed in the Korean Intellectual Property Office on Nov. 17, 2015, the entire contents of which are incorporated herein by reference.

BACKGROUND

1. Field

Embodiments relate to image sensors and electronic devices including the same.

2. Description of the Related Art

An imaging device generates an image and may store the same as an electrical signal. The imaging device includes an image sensor that dissembles the incident light into separate components according to incident light wavelength and converts each component to an electrical signal.

Image sensors have been increasingly miniaturized, and resolution of said miniaturized image sensors has been increased. Thus, there has been an ongoing demand for reduction of pixel sizes. However, as the pixel sizes are reduced in the case of currently primarily-used silicon photodiode, the absorption area may be also decreased. As a result, a sensitivity of the pixels may be reduced based on a reduction of pixel sizes.

SUMMARY

Some example embodiments provide an image sensor that may reduce light loss and improve sensitivity reduction while simplifying process.

Some example embodiments provide an electronic device including the image sensor.

According to some example embodiments, an image sensor may include a semiconductor substrate including a first photo-sensing device and a second photo-sensing device, wherein the first and second photo-sensing devices are integrated in the semiconductor substrate, the first photo-sensing device and the second photo-sensing device vertically overlap with each other in a thickness direction of the semiconductor substrate, the first photo-sensing device is configured to sense a first wavelength spectrum of visible light, and the second photo-sensing device is configured to sense a second wavelength spectrum of visible light; and a third photo-sensing device on the semiconductor substrate and configured to selectively sense a third wavelength spectrum of visible light, wherein the third wavelength spectrum of visible light is a longer wavelength spectrum of visible light than the first wavelength spectrum of visible light and the second wavelength spectrum of visible light.

The third photo-sensing device may include a pair of electrodes facing each other and a photo-sensing layer between the pair of electrodes, the photo-sensing layer configured to selectively absorb the third wavelength spectrum of visible light.

The pair of electrodes may be a light-transmitting electrode, the photo-sensing layer may include a p-type semiconductor and an n-type semiconductor, and at least one of the p-type semiconductor and the n-type semiconductor may be configured to selectively absorb the third wavelength spectrum of visible light.

The photo-sensing layer may have a thickness of about 1 nm to about 500 nm.

The third photo-sensing device may be proximate to a front surface of the image sensor, relative to the first photo-sensing device and the second photo-sensing device, wherein the image sensor is configured to receive incident light through the front surface.

The first visible light may be light in a longer wavelength spectrum of visible light than the second visible light, and the first photo-sensing device may be distal from an upper surface of the semiconductor substrate, relative to the second photo-sensing device.

The first photo-sensing device and the second photo-sensing device may be disposed to be adjacent to each other.

The first photo-sensing device may be thicker than the second photo-sensing device in a thickness direction of the semiconductor substrate.

The first visible light may be light in a green wavelength spectrum of visible light, the second visible light may be light in a blue wavelength spectrum of visible light, and the third visible light may be light in a red wavelength spectrum of visible light.

According to some example embodiments, an image sensor may include a first photo-sensing device configured to sense a first wavelength spectrum of visible light, a second photo-sensing device configured to sense a second wavelength spectrum of visible light, the second wavelength spectrum of visible light being a shorter wavelength spectrum of visible light than the first visible light, and a third photo-sensing device configured to sense a third wavelength spectrum of visible light, the third wavelength spectrum of visible light being a longer wavelength spectrum of visible light than the first wavelength spectrum of visible light and the second wavelength spectrum of visible light, the third photo-sensing device including a photo-sensing layer, wherein the first photo-sensing device, the second photo-sensing device and the third photo-sensing device vertically overlap with each other, and the photo-sensing layer of the third photo-sensing device is thinner than the first photo-sensing device and the second photo-sensing device.

The third photo-sensing device may further include a pair of electrodes facing each other, and the photo-sensing layer may be between the pair of electrodes and is configured to selectively absorb the third wavelength spectrum of visible light.

The pair of electrode may be a light-transmitting electrode, the photo-sensing layer may include a p-type semiconductor and an n-type semiconductor, and at least one of the p-type semiconductor and the n-type semiconductor may be configured to selectively absorb the third wavelength spectrum of visible light.

The first photo-sensing device, the second photo-sensing device and the third photo-sensing device may be sequentially stacked, and the third photo-sensing device may be disposed to be nearer to a light incidence side than the first photo-sensing device and the second photo-sensing device.

The first photo-sensing device may be thicker than the second photo-sensing device.

The first photo-sensing device and the second photo-sensing device may be integrated in a semiconductor substrate, and the third photo-sensing device may be on the semiconductor substrate.

The first photo-sensing device may be deeper than the second photo-sensing device from the surface of the semiconductor substrate.

The first photo-sensing device and the second photo-sensing device may be disposed to be adjacent to each other.

According to some example embodiments, an image sensor may include a semiconductor substrate including at least one photo-sensing device integrated in the semiconductor substrate, wherein the first photo-sensing device is configured to sense a first wavelength spectrum of visible light; and a second photo-sensing device on the semiconductor substrate and configured to selectively sense a second wavelength spectrum of visible light, wherein the second wavelength spectrum of visible light is a longer wavelength spectrum of visible light than the first wavelength spectrum of visible light.

The second photo-sensing device may include a pair of electrodes facing each other and a photo-sensing layer between the pair of electrodes. The photo-sensing layer may be configured to selectively absorb the second wavelength spectrum of visible light.

The pair of electrodes may include a light-transmitting electrode. The photo-sensing layer may include a p-type semiconductor and an n-type semiconductor. At least one of the p-type semiconductor and the n-type semiconductor may be configured to selectively absorb the second wavelength spectrum of visible light.

The photo-sensing layer may have a thickness of about 1 nm to about 500 nm.

The second photo-sensing device may be proximate to a front surface of the image sensor, relative to the first photo-sensing device, wherein the image sensor is configured to receive incident light through the front surface.

The second photo-sensing device may be distal to a front surface of the image sensor, relative to the first photo-sensing device, wherein the image sensor is configured to receive incident light through the front surface.

According to some example embodiments, an electronic device may include the image sensor.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1A:
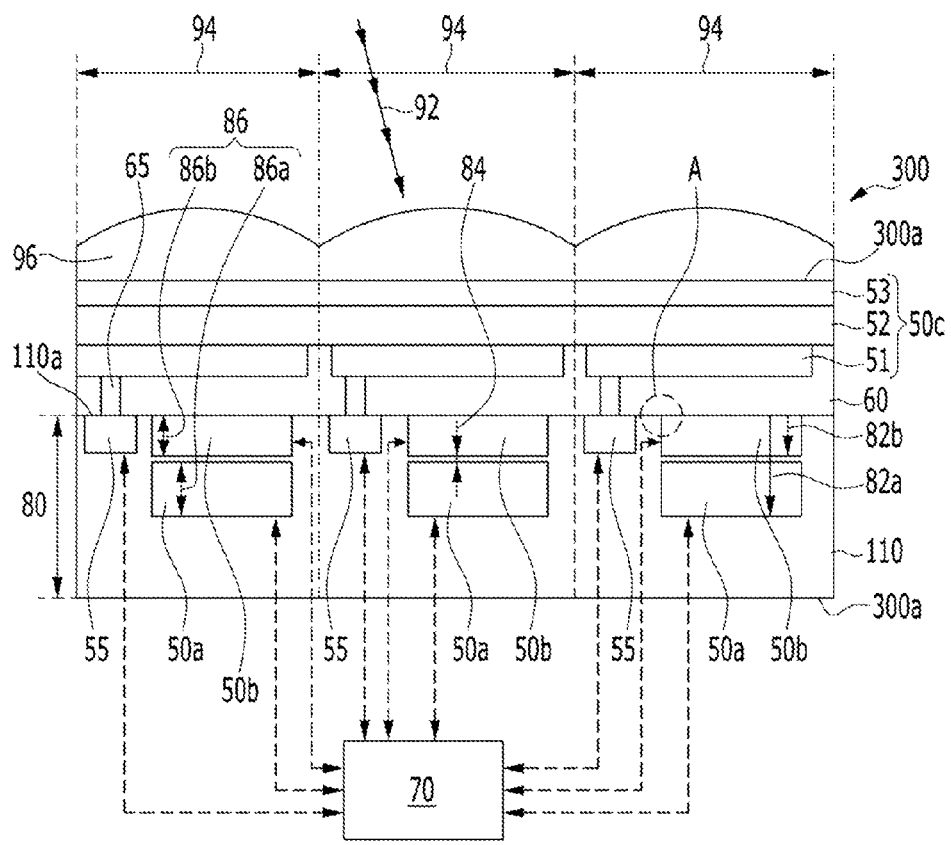
FIG. 1A is a cross-sectional view of an image sensor according to some example embodiments.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element, there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, an image sensor according to some example embodiments is described referring to drawings. Herein, a CMOS image sensor as an example of an image sensor is described.

Figure 1B:
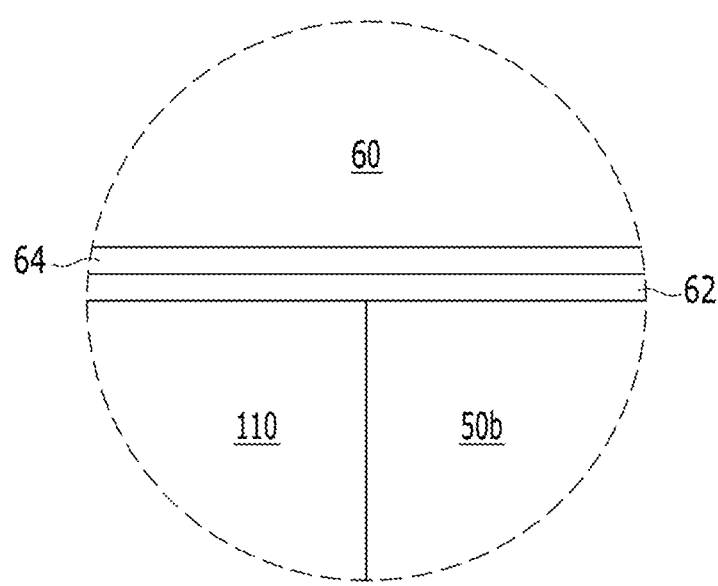
FIG. 1B is a cross-section view of a portion A of the image sensor illustrated in FIG. 1A.

FIG. 1A is a cross-sectional view of an image sensor according to some example embodiments. FIG. 1B is a cross-section view of a portion A of the image sensor 300 illustrated in FIG. 1A.

Referring to FIG. 1A and FIG. 1B, an image sensor 300 according to some example embodiments includes a semiconductor substrate 110 integrated with a first photo-sensing device 50*a*, a second photo-sensing device 50*b*, charge storage 55, and a transmission transistor 70, and a third photo-sensing device 50*c* disposed on the semiconductor substrate 110.

The semiconductor substrate 110 may be a silicon substrate, and is integrated with the first photo-sensing device 50*a*, the second photo-sensing device 50*b*, the charge storage 55, and the transmission transistor 70.

The first photo-sensing device 50*a* and second photo-sensing device 50*b* may be a photodiode. The first photo-sensing device 50*a* and the second photo-sensing device 50*b* sense light in separate wavelength spectra of light (herein, referred to as first and second light, respectively) and may generate separate, respective instances of information based on the sensing. The separate, respective instances of information associated with the light sensed by the first and second photo-sensing devices 50*a* and 50*b* may be transferred to the transmission transistor 70. The transmission transistor 70 may transmit received information to one or more additional devices, including one or more devices that are external to the image sensor 300. An image may be generated based on the information transmitted from the transmission transistor 70, where the image is associated with the incident light sensed at one or more elements of the image sensor 300. The charge storage 55 is electrically connected with the third photo-sensing device 50*c* and may receive information associated with the light sensed by the third photo-sensing device 50*c*, where such information is generated by one or more elements of the third-photo-sensing device 50*c* based on sensing one or more wavelength spectra of light. Information stored by the charge storage 55 may be transferred to the transmission transistor 70. The transmission transistor 70 may transmit received information, thereby transmitting information associated with the light sensed by the first, second, and third photo-sensing device 50*a*, 50*b*, and 50*c*. The transmission transistor 70 may transmit the information to one or external devices that are external to the image sensor 300. In some example embodiments, one of the photo-sensing device 50*a* and 50*b* may be omitted in at least one given region 94, such that an individual of one of the photo-sensing device 50*a* and 50*b* is integrated into the substrate 110 in the at least one given region 94. In some example embodiments, a portion of substrate 110 in a first region 94 may include an integrated first photo-sensing device 50*a* and omit an integrated second photo-sensing device 50*b*, while a second region 94 may include an integrated second photo-sensing device 50*b* and omit an integrated first photo-sensing device 50*a*. Where multiple regions 94 include an individual photo-sensing device, respectively, the individual photo-sensing devices in each region 94 may be at a common depth in the substrate 110, relative to surface 110*a*. In some example embodiments, the substrate 110 may include first and second photo-sensing devices 50*a* and 50*b* at a common depth 82*b* in the substrate.

As shown in the example embodiments illustrated in FIG. 1A, the first photo-sensing device 50*a* and the second photo-sensing device 50*b* may be disposed overlapping with each other in semiconductor substrate 110 in a thickness direction 80 of the semiconductor substrate 110. Such overlapping, shown in FIG. 1A, may also referred to as the first and second photo-sensing devices 50*a* and 50*b* vertically overlapping each other, the second photo-sensing device 50*b* vertically overlapping the first photo-sensing device 50*a*, the first photo-sensing device 50*a* vertically overlapping the second photo-sensing device 50*b*, some combination thereof, or the like. The first photo-sensing device 50*a* and the second photo-sensing device 50*b* may be disposed in different depths 82*a*, 82*b*, respectively, from the surface 110*a* of the semiconductor substrate 110. For example, the first photo-sensing device 50*a* may be disposed in a first depth 82*a* from the surface 110*a* of the semiconductor substrate 110, such that the first photo-sensing device 50*a* is deeper than the second photo-sensing device 50*b* from the surface of the semiconductor substrate 110, and the second photo-sensing device 50*b* may be disposed in a second depth 82*b* from the surface 110*a* of the semiconductor substrate 110, such that the second photo-sensing device 50*b* is nearer to the surface 110*a* of the semiconductor substrate 110 than the first photo-sensing device 50*a*.

The first photo-sensing device 50*a* and the second photo-sensing device 50*b* may sense light in different wavelength spectra of light relative to each other among a plurality of wavelength spectra of light according to the stacking depth. For example, the first photo-sensing device 50*a* disposed deep from the surface of semiconductor substrate 110 may sense light in a first wavelength spectrum of visible light (also referred to herein as 'first visible light'); and the second photo-sensing device 50*b* disposed in a place near to the surface of semiconductor substrate 110 may sense light in a second wavelength spectrum of visible light (also referred to herein as 'second visible light') which is shorter wavelength spectrum of visible light than in the first visible light.

The first visible light and the second visible light may each have a wavelength spectrum with a different maximum absorption wavelength ($\lambda_{max}$) region from each other. For example, the maximum absorption wavelength of the first visible light may be positioned in a longer wavelength spectrum of visible light by greater than or equal to about 30 nm than the maximum absorption wavelength of the second visible light, for example, in a longer wavelength spectrum of visible light by greater than or equal to about 50 nm.

In another example, the first visible light may have a maximum absorption wavelength at greater than or equal to about 500 nm and less than about 590 nm, and the second visible light may have a maximum absorption wavelength at greater than or equal to about 400 nm and less than about 500 nm. For example, the first visible light may have a maximum absorption wavelength at about 520 nm to about 580 nm, and the second visible light may have a maximum absorption wavelength at about 420 nm to about 480 nm.

In another example, the first photo-sensing device 50a may sense light in a green wavelength spectrum of visible light and the second photo-sensing device may sense light in a blue wavelength spectrum of visible light.

The first photo-sensing device 50a and the second photo-sensing device 50b may be disposed to be adjacent to each other in the vertical direction of the semiconductor substrate 110. The vertical direction of the semiconductor substrate 110 may be the same as the thickness direction 80 of the semiconductor substrate 110. The terms 'disposed to be adjacent to each other' may mean that the gap 84 between the first photo-sensing device 50a and the second photo-sensing device 50b is substantially non-existent or less than a threshold distance magnitude. For example, the gap 84 between the first photo-sensing device 50a and the second photo-sensing device 50b may be less than or equal to about 2 μm, for example, about 0 to about 1.6 μm.

The thickness sum (also referred to herein as the total thickness 86 and/or the sum of the individual thicknesses 86a and 86b) of the first photo-sensing device 50a and the second photo-sensing device 50b may be less than or equal to about 5 μm. In some example embodiments, the total thickness may be less than or equal to about 4 μm. In some example embodiments, the total thickness may be less than or equal to about 3 μm. In some example embodiments, the total thickness may be less than or equal to about 2 μm. In some example embodiments, the total thickness of the first photo-sensing device 50a and the second photo-sensing device 50b may range from about 0.3 μm to about 5 μm. In some example embodiments, the total thickness may range from about 0.5 μm to about 4 μm. In some example embodiments, the total thickness may range from about 0.5 μm to about 3 μm. In some example embodiments, the total thickness may range from about 0.5 μm to about 2 μm. In some example embodiments, the total thickness may range from about 0.5 μm to about 1.6 μm.

The first photo-sensing device 50a may be thicker than the second photo-sensing device 50b. For example, the first photo-sensing device 50a may have a thickness 86a of about 0.2 μm to about 3.0 μm, and the second photo-sensing device 50b may have a thickness 86b of about 0.1 μm to about 1.0 μm. Within the range, the first photo-sensing device 50a may have, for example a thickness 86a of about 0.3 μm to about 2.0 μm, and the second photo-sensing device 50b may have, for example a thickness 86b of about 0.1 μm to about 0.8 μm. Within the range, the first photo-sensing device 50a may have, for example a thickness 86a of about 0.5 μm to about 1.6 μm, and the second photo-sensing device 50b may have, for example a thickness 86b of about 0.2 μm to about 0.6 μm.

In some example embodiments, including the example embodiments shown in FIG. 1B, a metal wire 62 and a pad 64 are formed on the first photo-sensing device 50a and the second photo-sensing device 50b. In order to decrease signal delay, the metal wire 62 and pad 64 may at least partially comprise a metal having low resistivity, for example, aluminum (Al), copper (Cu), silver (Ag), and alloys thereof, but are not limited thereto. In some example embodiments, the metal wire 62 and pad 64 may be positioned under the first photo-sensing device 50a and the second photo-sensing device 50b.

Referring back to FIG. 1A, a lower insulation layer 60 is formed on the metal wire 62 and pad 64. The lower insulation layer 60 may at least partially comprise an inorganic insulating material including as a silicon oxide and/or a silicon nitride, or a low dielectric constant (low K) material such as SiC, SiCOH, SiCO, and SiOF. The lower insulation layer 60 has a trench 65 exposing the charge storage 55. The trench 65 may be filled with fillers. The insulation layer 60 may be omitted.

The third photo-sensing device 50c is formed on the insulation layer 60.

The third photo-sensing device 50c may selectively sense light in a third wavelength spectrum of visible light (also referred to herein as 'third visible light') in a longer wavelength spectrum of visible light than the first visible light and the second visible light.

The third photo-sensing device 50c may be disposed to be nearer to a light incident surface 300a of the image sensor 300 than the first photo-sensing device 50a and the second photo-sensing device 50b. The light incident surface 300a may be referred to herein interchangeably as the front surface 300a, upper surface 300a, upper side 300a, top side 300a, top surface 300a, or the like. That is, with reference to FIG. 1A, when incident light 92 enters the image sensor 300 through the front surface 300a, the third photo-sensing device 50c may be disposed on the front surface 300a of the semiconductor substrate 110. In some example embodiments, when incident light 92 enters the image sensor 300 through the rear surface 300b of semiconductor substrate 110, the third photo-sensing device 50c may be disposed on the rear surface 300b (e.g., lower side 300b) of the semiconductor substrate 110. As a result, the incident light may be passed through the third photo-sensing device 50c first and then reach to the second photo-sensing device 50b and the first photo-sensing device 50a.

As shown in the example embodiments illustrated in FIG. 1A, the third photo-sensing device 50c may include a lower electrode 51 and an upper electrode 53 facing each other, and a photo-sensing layer 52 between the lower electrode 51 and the upper electrode 53.

One of the lower electrode 51 and the upper electrode 53 is an anode and the other is a cathode. At least one of the lower electrode 51 and the upper electrode 53 may be a light-transmitting electrode, and the light-transmitting electrode may at least partially comprise, for example, a transparent conductor such as indium tin oxide (ITO) or indium zinc oxide (IZO). The light-transmitting electrode may be a metal thin layer having a thin thickness of several nanometers or several tens of nanometers or a metal thin layer having a thin thickness of several nanometers to several tens of nanometers. The light-transmitting electrode may be a metal thin layer that is doped with a metal oxide.

The photo-sensing layer 52 may be configured to selectively absorb the third visible light. The photo-sensing layer 52 may selectively absorb the third visible light and transmit one or more wavelengths of light except the third visible light. For example, the photo-sensing layer 52 may transmit the first visible light and the second visible light.

The third visible light may have a different maximum absorption wavelength ($\lambda_{max}$) region from the first visible light and the second visible light. For example, the maximum absorption wavelength of the third visible light may be positioned in a longer wavelength spectrum of visible light than the maximum absorption wavelengths of the first visible light and the second visible light by at least about 30 nm. In another example, the maximum absorption wavelength of the third visible light may be positioned in a longer wavelength spectrum of visible light than the maximum absorption wavelengths of the first visible light and the second visible light by at least about 50 nm.

In another example, the maximum absorption wavelength of the third visible light may be positioned in a longer wavelength spectrum of visible light than the maximum absorption wavelengths of the first visible light and the second visible light by at least about 590 nm and by less than at least about 700 nm. In another example, the maximum absorption wavelength of the third visible light may be positioned in a longer wavelength spectrum of visible light than the maximum absorption wavelengths of the first visible light and the second visible light by at least about 591 nm to about 670 nm.

In some example embodiments, the third photo-sensing device 50c may be configured to sense light in a red wavelength spectrum of visible light and the photo-sensing layer 52 may selectively absorb light in a red wavelength spectrum of visible light.

The photo-sensing layer 52 may include a p-type semiconductor and an n-type semiconductor, and the p-type semiconductor and the n-type semiconductor may form a p-n junction. The photo-sensing layer 52 may selectively absorb the third visible light exciton to generate excitons, then the generated excitons may be separated into holes and electrons, and then separated holes transfer to an anode that is one of the lower electrode 51 and the upper electrode 53 and separated electrons transfer to a cathode that is one of the lower electrode 51 and the upper electrode 53 to provide a photoelectric effect. The separated electrons and/or holes may be collected in the charge storage 55.

At least one of the p-type semiconductor and the n-type semiconductor may selectively absorb the third visible light. The p-type semiconductor and the n-type semiconductor may independently include an organic material, an inorganic material, or an organic/inorganic material. For example, at least one of the p-type semiconductor and the n-type semiconductor may be an organic material. The organic material may include, for example, metal phthalocyanine, metal oxide phthalocyanine or a derivative thereof, copper phthalocyanine, zinc phthalocyanine, titanyl phthalocyanine or a derivative thereof, but may be any material selectively absorbing the third visible light without limitation.

The photo-sensing layer 52 may be a single layer or a multilayer. The photo-sensing layer 52 may be, for example an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within the range, an exciton may be effectively produced and a p-n junction may be effectively formed.

The p-type layer may include the p-type semiconductor, and the n-type layer may include the n-type semiconductor.

The photo-sensing layer 52 may be thinner than the first photo-sensing device 50a and the second photo-sensing device 50b.

The photo-sensing layer 52 may have a thickness of about 1 nm to about 500 nm. In some example embodiments, the photo-sensing layer 52 may have a thickness of about 300 nm. In some example embodiments, the photo-sensing layer 52 may have a thickness of about 5 nm to about 200 nm. If and/or when the thickness of the photo-sensing layer 52 is within one or more of the above thickness ranges, the photo-sensing layer 52 may effectively absorb the third visible light, effectively separate holes from electrons, and transmit them, thereby effectively improving photoelectric conversion efficiency.

The photo-sensing layer 52 may be formed on the whole surface of the image sensor image sensor 300. Thereby, as the third visible light may be selectively absorbed on the whole surface of the image sensor, the light area may be increased to provide high light-absorptive efficiency.

A focusing lens 96 may be further formed on the upper electrode 53. The focusing lens 96 may control a direction of incident light 92 and gather the light in one region 94. As shown in the example embodiments illustrated in FIG. 1A, each region 94 may be at least partially defined by a region of the image sensor 300 in which at least one set of a first photo-sensing device 50a, a second photo-sensing device 50b, and at least a portion of a third photo-sensing device 50c vertically overlapped. The focusing lens may have a shape of, for example, a cylinder or a hemisphere, but is not limited thereto.

As described above, the image sensor 300 according to some example embodiments has a structure in which a first photo-sensing device sensing first visible light 50a, a second photo-sensing device 50b sensing second visible light and a third photo-sensing device 50c sensing third visible light are stacked (e.g., vertically overlapped), so the area of image sensor 300 may be decreased. As a result, the image sensor 300 may be down-sized.

In some example embodiments, the first photo-sensing device 50a and the second photo-sensing device 50b may separate and sense separate wavelength spectra of incident light 92 according to the stacking depth 82a, 82b of the respective first photo-sensing device 50a and the second photo-sensing device 50b in the semiconductor substrate 110. As a result, the image sensor 300 may omit an additional color filter and wavelength separation layer. The image sensor may be configured to omit a color filter and a wavelength separation layer, so that the image sensor 300 and process of manufacturing same may be simplified, and also the light loss due to the color filter and the wavelength separation layer may be reduced, so as to enhance the adsorptive efficiency. In some example embodiments In addition, the third photo-sensing device 50c may extend over the entire surface 300a of image sensor 300, so the area of the image sensor 300 configured to absorb incident light 92 is increased to further enhance the absorptive efficiency.

In some example embodiments, as the third photo-sensing device 50c configured to sense third visible light is separately formed on the semiconductor substrate 110, the process of manufacturing the image sensor 300 may be simplified by omitting the process of forming a photo-sensing device for sensing third visible light in the semiconductor substrate 110. In addition, as the third photo-sensing device 50c configured to sense third visible light is disposed proximate to the upper surface 300a of the image sensor 300, relative to the first photo-sensing device 50a and the second photo-sensing device 50b, the third photo-sensing device 50c may improve the optical and electric characteristics of the image sensor 300.

In some example embodiments, the third photo-sensing device 50c configured to sense third visible light in a long wavelength spectrum of visible light may be disposed in the image sensor at a location that is distal from the front surface 300a, and in a thicker thickness, relative to the first photo-sensing device 50a and the second photo-sensing device 50b, considering the wavelength separating characteristics according to the stacking depth. For example, the surface exposed to incident light 92 may be surface 300b, such that the third photo-sensing device is distal from the surface 300b that is configured to receive incident light 92. In this case, it is difficult in the process to provide the photo-sensing device for sensing third visible light in a deep place as much as several to several ten micrometers, and the electric characteristics according to the depth may be deteriorated. As the distance is going farther from the light incident direction, the sensing efficiency of incident light may be deteriorated, and particularly, tilted incident light from the surface of semiconductor substrate 110 may be not reached into the thickly-formed photo-sensing device but inflow into adjacent pixels, causing an optical crosstalk.

For example, the characteristics of the photo-sensing device for sensing third visible light according to the place may be confirmed by the simulation evaluation.

In a first example embodiment, an image sensor 300 may include a first photo-sensing device 50a configured to sense green light and a second photo-sensing device 50b configured to sense blue light are vertically stacked adjacent to each other in the semiconductor substrate 110, and a third photo-sensing device 50c configured to sense red light is disposed on the light incident side 300a.

In a reference example embodiment, an image sensor 300 may include a photo-sensing device 50a configured to sense blue light and a photo-sensing device 50b configured to sense red light are sequentially stacked in the semiconductor substrate 110, and a photo-sensing device 50c configured to sense green light is disposed on the semiconductor substrate 110.

In a simulation evaluation of the First Example Embodiment and the Reference Example Embodiment, the spectroscopic sensitivity of green, blue and red photo-sensing devices of obtained image sensors is obtained by FDTD (Finite Difference Time Domain); and the wavelength spectrum of incident light 90 is divided into three regions of 440-480 nm (blue), 520-560 nm (green), 590-630 nm (red), respectively, so it is evaluated how light having the different wavelength spectrum of visible light is optically interfered in each region.

The results are shown in Table 1.

TABLE 1

|  | Optical crosstalk (%) |
| --- | --- |
| First Example Embodiment | 22 |
| Reference Example Embodiment | 31 |

Referring to Table 1, it is confirmed that the image sensor in which the third photo-sensing device 50c sensing red light is disposed in the light incident side 300a has a relatively low optical crosstalk.

The image sensor 300 may be a front side illumination type or a back side illumination type, but is not particularly limited.

Figure 2:
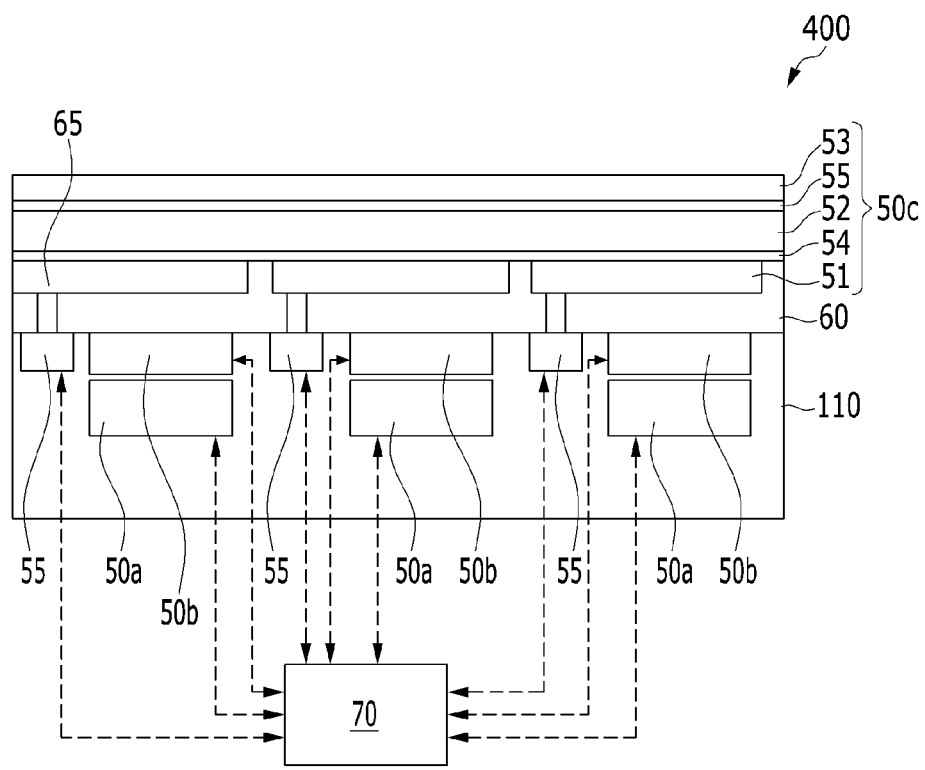
FIG. 2 is a cross-sectional view of an image sensor according to some example embodiments.

FIG. 2 is a cross-sectional view of an image sensor according to some example embodiments.

Referring to FIG. 2, the image sensor 400 according to some example embodiments includes a semiconductor substrate 110 integrated with a first photo-sensing device 50a, a second photo-sensing device 50b, a charge storage 55, a transmission transistor 70, an insulation layer 60 and a third photo-sensing device 50c.

In some example embodiments, the third photo-sensing device 50c includes auxiliary layers 54 and 55 between the lower electrode 51 and the photo-sensing layer 52 and between the upper electrode 53 and the photo-sensing layer 52, respectively.

The auxiliary layers 54 and 55 may be configured to improve charge transfer and extraction between the lower electrode 51 and the photo-sensing layer 52 and/or the upper electrode 53 and the photo-sensing layer 52. For example, the auxiliary layers 54 and 55 may be at least one selected from a hole extraction layer for facilitating hole extraction, a hole transport layer (HTL) for facilitating hole transport, an electron blocking layer for limiting and/or preventing electron transport, an electron extraction layer for facilitating electron extraction, an electron transport layer (ETL) for facilitating electron transport, and a hole blocking layer for limiting and/or preventing hole transport, but are not limited thereto.

The auxiliary layers 54 and 55 may include, for example, an organic material, an inorganic material, or an organic/inorganic material. The organic material may be an organic compound having hole or electron characteristics, and the inorganic material may be, for example, a metal oxide such as molybdenum oxide, tungsten oxide, nickel oxide, and the like.

The image sensor may be applied to various electronic devices, for example, a mobile phone, a digital camera, a biosensor, and the like, but is not limited thereto.

Figure 3:
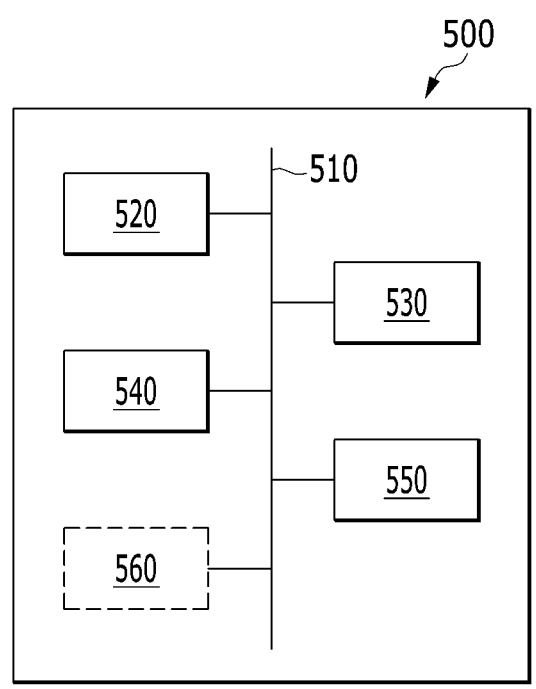
FIG. 3 is a diagram illustrating an electronic device according to some example embodiments.

FIG. 3 is a diagram illustrating an electronic device 500 according to some example embodiments.

Referring to FIG. 3, the electronic device 500 includes a memory 520, a processor 530, an image sensor 540, and a communication interface 550. The image sensor 540 may include any of the image sensors illustrated and described herein, including image sensor 300 shown in FIGS. 1A-B and image sensor 400 shown in FIG. 4.

The electronic device 500 may be included in one or more various electronic devices, including, for example, a mobile phone, a digital camera, a sensor device, a biosensor device, and the like. In some example embodiments, the electronic device 500 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 520, the processor 530, the image sensor 540, and the communication interface 550 may communicate with one another through a bus 510.

The communication interface 550 may communicate data from an external device using various Internet protocols. For example, the communication interface 550 may communicate sensor data generated by the image sensor 540 to an external device. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 530 may execute a program and control the electronic device 500. A program code to be executed by the processor 530 may be stored in the memory 520. An electronic system may be connected to an external device through an input/output device (not shown) and exchange data with the external device.

The memory 520 may store information output from the image sensor 540, including information transmitted from the transistor 70. The memory 520 may be a volatile or a nonvolatile memory. The memory 520 may be a non-transitory computer readable storage medium. The memory may store computer-readable instructions that, when executed, cause the execution of one or more methods, functions, processes, etc. as described herein. In some example embodiments, the processor 530 may execute one or more of the computer-readable instructions stored at the memory 520.

In some example embodiments, the electronic device may include a display panel 560 that may output an image generated based at least in part upon information output from the image sensor 540.

In some example embodiments, element 560 may be absent from the electronic device 500. In some example embodiments, the communication interface 550 may include a USB and/or HDMI interface. In some example embodiments, the communication interface 550 may include a wireless communication interface.

While this disclosure has been described in connection with what is presently considered to be practical example embodiments, it is to be understood that the invention is not limited to the disclosed example embodiments, but, in some example embodiments, is intended to cover various modifications and equivalent arrangements included within the spirit and scope of the appended claims.

What is claimed is:

1. An image sensor, comprising:
   a semiconductor substrate including a first photo-sensing device and a second photo-sensing device, wherein the first and second photo-sensing devices are integrated in the semiconductor substrate, the first photo-sensing device and the second photo-sensing device vertically overlap with each other in a thickness direction of the semiconductor substrate, the first photo-sensing device is configured to sense a first wavelength spectrum of visible light, and the second photo-sensing device is configured to sense a second wavelength spectrum of visible light; and
   a third photo-sensing device on the semiconductor substrate and configured to selectively sense a third wavelength spectrum of visible light, wherein the third wavelength spectrum of visible light is a longer wavelength spectrum of visible light than the first wavelength spectrum of visible light and the second wavelength spectrum of visible light.

2. The image sensor of claim 1, wherein,
   the third photo-sensing device includes,
      a pair of electrodes facing each other, and
      a photo-sensing layer between the pair of electrodes, the photo-sensing layer configured to selectively absorb the third wavelength spectrum of visible light.

3. The image sensor of claim 2, wherein,
   the pair of electrodes includes a light-transmitting electrode,
   the photo-sensing layer includes a p-type semiconductor and an n-type semiconductor, and
   at least one of the p-type semiconductor and the n-type semiconductor is configured to selectively absorb the third wavelength spectrum of visible light.

4. The image sensor of claim 2, wherein the photo-sensing layer has a thickness of about 1 nm to about 500 nm.

5. The image sensor of claim 1, wherein the third photo-sensing device is proximate to a front surface of the image sensor, relative to the first photo-sensing device and the second photo-sensing device, wherein the image sensor is configured to receive incident light through the front surface.

6. The image sensor of claim 1, wherein,
   the first wavelength spectrum of visible light is light in a longer wavelength spectrum of visible light than the second wavelength spectrum of visible light, and
   the first photo-sensing device is distal from an upper surface of the semiconductor substrate, relative to the second photo-sensing device.

7. The image sensor of claim 1, wherein the first photo-sensing device and the second photo-sensing device are adjacent to each other.

8. The image sensor of claim 1, wherein the first photo-sensing device is thicker than the second photo-sensing device in a thickness direction of the semiconductor substrate.

9. The image sensor of claim 1, wherein the first wavelength spectrum of visible light is light in a green wavelength spectrum of visible light,
   the second wavelength spectrum of visible light is light in a blue wavelength spectrum of visible light, and
   the third wavelength spectrum of visible light is light in a red wavelength spectrum of visible light.

10. An electronic device including the image sensor of claim 1.

11. An image sensor, comprising:
   a first photo-sensing device configured to sense a first wavelength spectrum of visible light;
   a second photo-sensing device configured to sense a second wavelength spectrum of visible light, the second wavelength spectrum of visible light being a shorter wavelength spectrum of visible light than the first wavelength spectrum of visible light; and
   a third photo-sensing device configured to sense a third wavelength spectrum of visible light, the third wavelength spectrum of visible light being a longer wavelength spectrum of visible light than the first wavelength spectrum of visible light and the second wavelength spectrum of visible light, the third photo-sensing device including a photo-sensing layer;
   wherein
      the first photo-sensing device, the second photo-sensing device and the third photo-sensing device vertically overlap with each other, and
      the photo-sensing layer of the third photo-sensing device is thinner than the first photo-sensing device and the second photo-sensing device.

12. The image sensor of claim 11, wherein,
the third photo-sensing device further includes a pair of electrodes facing each other, and
the photo-sensing layer is between the pair of electrodes and is configured to selectively absorb the third wavelength spectrum of visible light.

13. The image sensor of claim 12, wherein,
the pair of electrodes includes a light-transmitting electrode,
the photo-sensing layer includes a p-type semiconductor and an n-type semiconductor, and
at least one of the p-type semiconductor and the n-type semiconductor is configured to selectively absorb the third wavelength spectrum of visible light.

14. The image sensor of claim 11, wherein,
the first photo-sensing device, the second photo-sensing device and the third photo-sensing device are sequentially stacked, and
the third photo-sensing device is disposed to be nearer to a light incidence side than the first photo-sensing device and the second photo-sensing device.

15. The image sensor of claim 11, wherein the first photo-sensing device is thicker than the second photo-sensing device.

16. The image sensor of claim 11, wherein the first photo-sensing device and the second photo-sensing device are integrated in a semiconductor substrate, and
the third photo-sensing device is on the semiconductor substrate.

17. The image sensor of claim 16, wherein the first photo-sensing device is disposed deeper than the second photo-sensing device from the surface of the semiconductor substrate.

18. The image sensor of claim 16, wherein the first photo-sensing device and the second photo-sensing device are adjacent to each other.

19. The image sensor of claim 16, wherein the first photo-sensing device is thicker than the second photo-sensing device.

20. The image sensor of claim 11, wherein the first wavelength spectrum of visible light is light in a green wavelength spectrum of visible light,
the second wavelength spectrum of visible light is light in a blue wavelength spectrum of visible light,
the third wavelength spectrum of visible light is light in a red wavelength spectrum of visible light.

21. An electronic device including the image sensor of claim 11.

* * * * *